(12) United States Patent
O et al.

(10) Patent No.: US 7,372,720 B1
(45) Date of Patent: May 13, 2008

(54) METHODS AND APPARATUS FOR DECREASING SOFT ERRORS AND CELL LEAKAGE IN INTEGRATED CIRCUIT STRUCTURES

(75) Inventors: Hugh S O, Fremont, CA (US); Chih-Ching Shih, Pleasanton, CA (US); Cheng-Hsiung Huang, Cupertino, CA (US); Yow-Juang B Lu, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/059,280

(22) Filed: Feb. 16, 2005

(51) Int. Cl.
*G11C 11/00* (2006.01)
(52) U.S. Cl. ........................ 365/154; 354/194; 354/161
(58) Field of Classification Search ................ 365/154, 365/229, 104, 161
See application file for complete search history.

(56) References Cited

U.S. PATENT DOCUMENTS

| | | | |
|---|---|---|---|
| 4,513,167 A | 4/1985 | Brandstetter | |
| 5,581,501 A | 12/1996 | Sansbury et al. | |
| 5,594,267 A | 1/1997 | Ema et al. | |
| 5,739,564 A | 4/1998 | Kosa et al. | |
| 5,812,450 A | 9/1998 | Sansbury et al. | |
| 5,904,512 A | 5/1999 | Chang et al. | |
| 5,940,852 A | 8/1999 | Rangasayee et al. | |
| 6,028,787 A | 2/2000 | Sansbury et al. | |
| 6,058,452 A | 5/2000 | Rangasayee et al. | |
| 6,093,597 A | 7/2000 | Hayashi | |
| 6,115,312 A | 9/2000 | Jefferson et al. | |
| 6,172,900 B1 | 1/2001 | Mejia | |
| 6,251,713 B1 * | 6/2001 | Chan et al. | 438/152 |
| 6,259,643 B1 | 7/2001 | Li | |
| 6,269,020 B1 | 7/2001 | Turner | |
| 6,323,072 B1 | 11/2001 | Shunpei et al. | |
| 6,353,551 B1 | 3/2002 | Lee | |
| 6,368,514 B1 | 4/2002 | Metzler | |
| 6,501,692 B1 * | 12/2002 | Melanson et al. | 365/201 |
| 6,737,712 B2 | 5/2004 | Hashimoto et al. | |
| 6,876,572 B2 | 4/2005 | Turner | |

(Continued)

FOREIGN PATENT DOCUMENTS

EP 0 357 980 B1 3/1990

OTHER PUBLICATIONS

International Search Report, issued Jul. 5, 2006 in counterpart international application No. PCT/US2006/002726.

(Continued)

*Primary Examiner*—Thong Q. Le
(74) *Attorney, Agent, or Firm*—Ropes & Gray LLP; Robert R. Jackson; Chia-Hao La

(57) ABSTRACT

Methods and apparatus are provided for decreasing soft errors and cell leakage in integrated circuit structures. The structures of the invention preferably include memory cells that utilize thin-film transistors ("TFTs") for the pull-up and pull-down transistors, and well as for the pass-gates. These TFTs preferably include features such as ion implants and a dielectric with a high dielectric constant "K." In addition to reducing soft errors and cell leakage, the invention preferably provides other benefits such as low cell area and scalability.

19 Claims, 3 Drawing Sheets

U.S. PATENT DOCUMENTS

| | | | |
|---|---|---|---|
| 6,934,182 B2 * | 8/2005 | Chan et al. | 365/154 |
| 2001/0028059 A1 * | 10/2001 | Emma et al. | 257/67 |
| 2002/0053672 A1 | 5/2002 | Shunpei et al. | |
| 2004/0113207 A1 * | 6/2004 | Hsu et al. | 257/368 |
| 2004/0155281 A1 | 8/2004 | Kenichi et al. | |
| 2005/0111251 A1 * | 5/2005 | Liaw | 365/154 |

OTHER PUBLICATIONS

U.S. Appl. No. 10/883,091, filed Jul. 1, 2004, Sidhu et al.

Y.H. Kim, et al., "High-Performance Ultralow-Temperature Polycrystalline Silicon TFT Using Sequential Lateral Solidification," *IEEE Electron Device Letters*, vol. 25, No. 8, Aug. 2004.

\* cited by examiner

METHODS AND APPARATUS FOR DECREASING SOFT ERRORS AND CELL LEAKAGE IN INTEGRATED CIRCUIT STRUCTURES

BACKGROUND OF THE INVENTION

This invention relates to integrated circuit ("IC") structures. More particularly, this invention relates to decreasing soft errors and cell leakage in IC structures.

When alpha or neutron particles penetrate the silicon of an IC (e.g., due to atmospheric radiation or similar causes), some particles collide with silicon atoms and generate electrical charges. For instance, charges can be generated in the depletion region of an IC structure. Alpha particles can create an extended depletion region along its track, known as a funneling region. Charges generated in the funneling region can be collected in a node of the IC structure. Charges can also be generated outside the depletion region and diffuse to the depletion region of the node. In addition, the collision of neutron particles with silicon atoms can trigger reactions that lead to the emission of alpha particles, which can in turn lead to further charge generation. The resulting charges can alter a voltage of an IC structure, a phenomenon often referred to as a soft error or single event upset.

Soft errors are especially significant when they occur in memory cells. The information stored by a node of a memory cell may be corrupted or reversed in polarity as a result of the soft error. This corruption can lead to improper operation of an IC or system that uses the memory. IC memories become more susceptible to soft errors as the transistors used in such memories become smaller. In addition, smaller transistors can lead to greater cell leakage.

Several approaches have been taken to make IC structures less susceptible to soft errors. These approaches often make use of thin-film transistors ("TFTs"). For instance, one known approach uses TFTs for the pull-up transistors of memory cells, with a metal dielectric. Bulk silicon transistors are used for pull-down transistors and pass-gates. Unfortunately, memory cells employing this approach are still susceptible to soft errors due to the partial use of bulk silicon transistors. In addition, metal dielectrics are typically thick (e.g., several tenths of a micron), resulting in either weak gate drive or larger devices.

Another approach employs TFTs in a way designed to optimize IC performance. Aluminum oxide is used as the dielectric material, resulting in a very high dielectric constant "K." Unfortunately, such cells require ultra-low-temperature fabrication techniques that are typically not available among standard complementary metal-oxide semiconductor ("CMOS") processes. In addition, such transistors tend to be relatively large, making them undesirable for memories with a relatively large number of cells.

In view of the foregoing, it would be desirable to provide IC memory structures with high immunity to soft errors and low cell leakage. In addition, it would be desirable to make such IC memory structures relatively small in size.

SUMMARY OF THE INVENTION

In accordance with this invention, circuitry and methods are provided for memory cells with high immunity to soft errors, low cell leakage, and small size. In one embodiment, TFTs are used for the pull-up and pull-down transistors, as well as for the pass-gates of the memory cells. In addition, a high-K dielectric is preferably used.

The use of TFTs reduces the track length available for alpha and neutron particles to collide with silicon atoms, resulting in a significant reduction in charge generation and soft errors. A preferred embodiment utilizes a metal gate with a relatively thin high-K dielectric, resulting in high current drive and low gate leakage.

The invention may provide other benefits as well. For instance, tight polysilicon spacing and the absence of wells in cells utilizing thin-film transistors may result in a significant reduction in memory cell area. In addition, the use of TFTs may eliminate latch-up effects.

The invention therefore advantageously provides methods and apparatus for reducing soft errors and cell leakage in IC memory structures. The invention also allows for decreased IC memory cell area.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
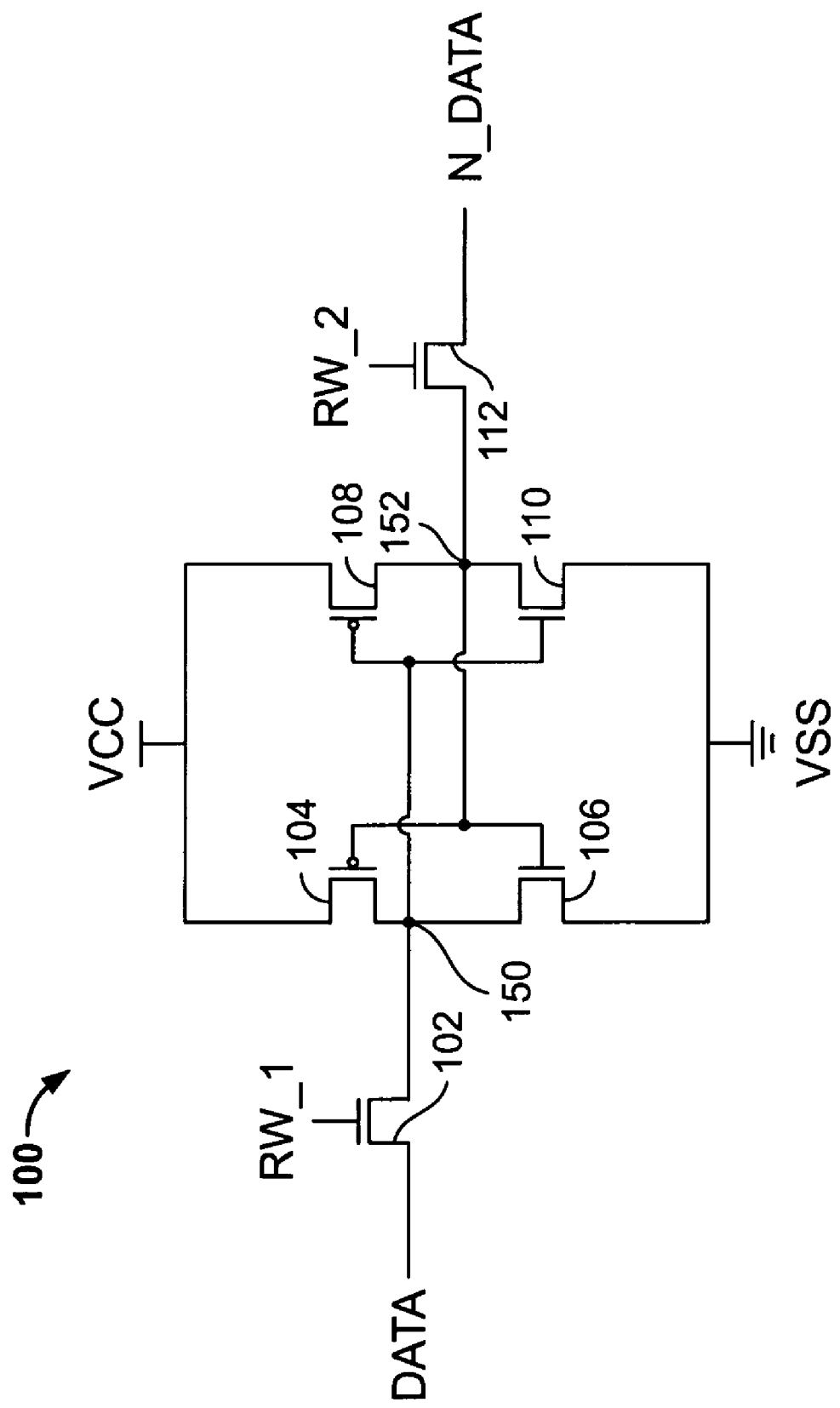
FIG. 1 is a circuit diagram of an illustrative memory cell.

FIG. 1 is a circuit diagram of an illustrative memory cell 100. The cell preferably includes P-type metal oxide semiconductor ("PMOS") transistor 104, N-type metal oxide semiconductor ("NMOS") transistor 106, PMOS transistor 108, and NMOS transistor 110, connected in a double-inverter configuration. PMOS transistors 104 and 108 are often referred to as pull-up transistors, while NMOS transistors 106 and 110 are often referred to as pull-down transistors. Reference voltages are provided through the power source ("VCC") and ground ("VSS"). Read and write access to the memory cell is preferably provided through transistors 102 and 112, often referred to as pass-gates, which in the embodiment shown are NMOS transistors.

Data is preferably written to memory cell 100 as follows. Signals DATA and N_DATA are set to appropriate complementary logical values. For instance, DATA may be set to a logical 1 while N_DATA may be set to a logical 0. Then, signals RW_1 and RW_2 are set to appropriate values to activate pass-gates 102 and 112. In the embodiment shown, both RW_1 and RW_2 would be set to a logical 1. Proceeding under the assumption that DATA and N_DATA are logical 1 and 0, respectively, pull-up transistor 104 and pull-down transistor 110 would be activated, while pull-down transistor 106 and pull-up transistor 108 would be deactivated, tying node 150 to VCC (logical 1) and node 152 to VSS (logical 0). When all voltages in cell 100 have settled, the values of signals RW_1 and RW_2 are preferably switched, so that pass-gates 102 and 112 are deactivated and the voltages at nodes 150 and 152 remain fixed.

Data is preferably read from cell 100 by setting RW_1 and RW_2 appropriately so that pass-gates 102 and 112 are activated. Then the voltage stored at nodes 150 and 152 will be asserted on signals DATA and N_DATA, respectively. Since read operations often weaken the voltage stored at nodes 150 and 152, memory cell 100 may need to be periodically refreshed through appropriate write operations. The pull-up transistors, pull-down transistors, and pass-gates are preferably TFTs, such as those illustrated in FIGS. 2 and 3 in accordance with the invention.

Figure 2:
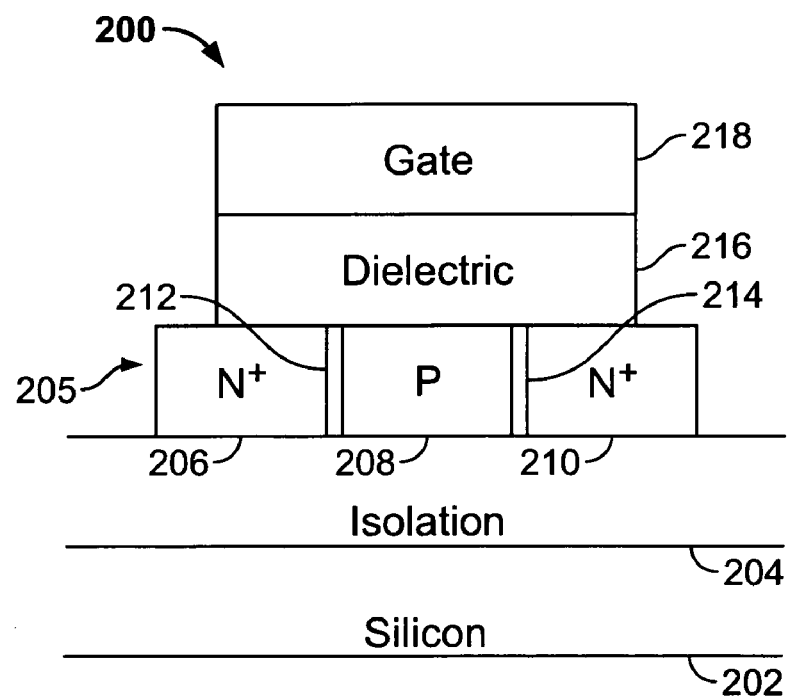
FIG. 2 is a diagram of an illustrative N-type metal oxide semiconductor ("NMOS") TFT in accordance with the invention.

FIG. 2 is a diagram of an illustrative NMOS TFT 200 in accordance with the invention. Isolation 204 is preferably deposited on top of silicon base 202, and can be made of any suitable insulating material, such as the trench isolation oxide normally used to separate transistors in an IC. Thin film 205 is preferably deposited on top of isolation 204, and is preferably made of polysilicon.

Thin film 205 is preferably doped to define an N+ region 206, a P region 208, and an N+ region 210. The doping levels of N+ regions 206 and 210 are preferably higher than the doping level of P region 208. These three regions are preferably separated by ion implants 212 and 214, which decrease leakage and punch-through by raising the doping level of P region 208. Ion implants 212 and 214 can be of any suitable type, such as LDD1, LDD2, and halo. Dielectric 216 preferably provides separation between thin film 205 and gate 218, which is preferably made of metal.

Figure 3:
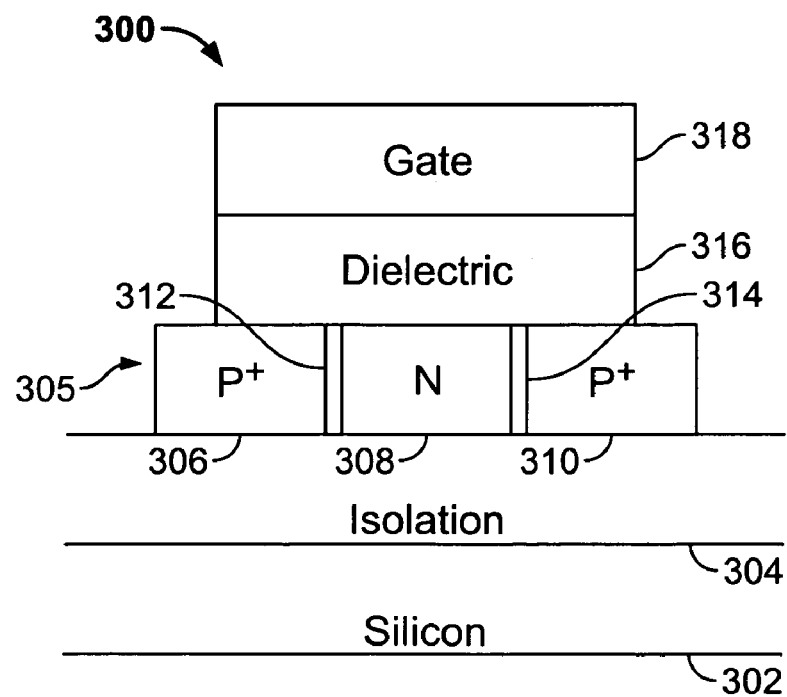
FIG. 3 is a diagram of an illustrative P-type metal oxide semiconductor ("PMOS") TFT in accordance with the invention.

FIG. 3 is a diagram of an illustrative PMOS TFT 300 in accordance with the invention, constructed similarly to NMOS TFT 200. Isolation 304 is preferably deposited on top of silicon base 302, and can be made of any suitable insulating material, such as the trench isolation oxide normally used to separate transistors in an IC. Thin film 305 is preferably deposited on top of isolation 304, and is preferably made of polysilicon.

Thin film 305 is preferably doped to define a P+ region 306, an N region 308, and a P+ region 310. The doping levels of P+ regions 306 and 310 are preferably higher than the doping level of N region 308. These three regions are preferably separated by ion implants 312 and 314, to decrease leakage and punch-through by raising the doping level of N region 308. Ion implants 312 and 314 can be of any suitable type, such as LDD1, LDD2, and halo. Dielectric 316 preferably provides separation between thin film 305 and gate 318, which is preferably made of metal.

The use of TFTs 200 and 300 provides many benefits over a typical bulk silicon transistor, especially when used in memory cells, such as those found in the configuration random access memory ("CRAM") of a programmable logic device ("PLD"). For instance, TFTs provide substantially higher immunity to soft errors. The relative thinness of thin polysilicon films 205 and 305 results in a shorter track length along which alpha and neutron particles can travel. This shorter track length leads to lower charge generation and collection, thereby reducing the probability of a soft error occurring.

Alpha particles can typically penetrate only a fraction of the thickness of the silicon on a transistor. Using current fabrication techniques, for example, a normal bulk silicon transistor may allow alpha particles to penetrate roughly 25 µm. In contrast, a modern TFT might permit an alpha particle penetration of only about 0.25 µm. Since the alpha particle track length is reduced by about two orders of magnitude, the amount of charge generated from those alpha particles would also be reduced by roughly the same amount.

Neutron particles, on the other hand, are typically able to penetrate the entire thickness of the silicon on a transistor. Since the thin polysilicon film of a TFT is often significantly (e.g., two orders of magnitude) thinner than the bulk silicon of a normal transistor, the probability of neutrons colliding with silicon atoms is reduced by roughly the same amount. This lower collision probability leads to lower amounts of burst charge.

Unfortunately, this improvement may be mitigated by the fact that neutron-silicon collisions tend to emit alpha particles, which (as discussed above) can themselves generate charge. However, the charges generated by the alpha particles tend to have lower mobility and diffusion rate in polysilicon due to scattering at the grain boundaries, which reduces the rate of charge collection. Thus, the charge collection resulting from the penetration of neutron particles is still significantly lower (e.g., two orders of magnitude) than the charge collection in a bulk silicon transistor.

By reducing the amount of charge collected as a result of alpha and neutron particles, the use of TFTs 200 and 300 can greatly reduce the likelihood of a soft error occurring. In the example discussed above, the probability of a soft error can be reduced by approximately two orders of magnitude, greatly improving the robustness of the circuitry in which the TFTs are used.

The use of TFTs can also significantly reduce the amount of current leakage. For instance, the use of ion implants 212, 214, 312, and 314 can reduce leakage by raising the doping level of thin films 205 and 305 between the source and drain areas. In addition, sub-threshold leakage can be reduced by using higher-than-minimum channel lengths and by adjusting the TFT threshold voltage appropriately.

Current leakage can be even further reduced by increasing the grain size of thin films 205 and 305, which reduces both the grain boundaries and the charge transportation along those grain boundaries. The grain size of thin films 205 and 305 can be increased by performing a high-temperature anneal after the polysilicon is deposited on isolation 204 or 304, or by another other suitable means. The depth of ion implants 212, 214, 312, and 314 are preferably adjusted during the anneal process to account for the resultant additional drive.

Dielectrics 216 and 316 are preferably made of material with a high dielectric constant "K," which also reduces gate leakage. The K-value is preferably higher than the K-value of silicon dioxide, permitting a relatively thick dielectric to be used. However, the K-value need not be very high in certain applications. For instance, if the TFTs are used in configuration random-access memory ("CRAM"), speed is not a high priority and very high K-values are unnecessary.

In addition to reducing the probability of soft errors and current leakage of memory cells, the use of TFTs 200 and 300 can provide other advantages in IC memory structures. For instance, memory cell area can be substantially reduced. The design rules applied to TFTs 200 and 300 allow for relatively small spacing between the gates of neighboring transistors. In addition, there is no trench isolation separating the transistors of a memory cell, as there would be with a standard bulk silicon transistor. Also, the lack of P-wells and N-wells can further reduce the area requirements of a memory cell using TFTs 200 and 300. These benefits can result in a cell area reduction of approximately 20% over traditional memory cells. Further advantages include the higher gate breakdown strength and lower gate leakage provided by the high-K dielectric, the conservation of active silicon area (as opposed to isolation area) on an IC, and the elimination of latch-up issues in memory cell transistors.

Thus, the use of TFTs 200 and 300 in memory cells, such as illustrative memory cell 100, can provide substantial benefits. The rate of soft errors and cell leakage can be decreased significantly (e.g., by several orders of magnitude) over standard bulk silicon transistors. In addition, memory cell area can be significantly reduced, resulting in a more compact and scalable design. Other benefits include higher gate breakdown strength, lower gate leakage, and the elimination of latch-up issues. These benefits are achieved without significant performance cost and without the use of non-standard fabrication techniques. The invention is preferably used in CRAM, such as that found on a PLD, or other memory structures where access is relatively infrequent and ensuring data integrity is more important than optimizing memory speed.

It will be noted that the embodiments shown and described herein are merely illustrative. For instance, the invention need not be applied in CRAM, or in memory cells such as the one shown in FIG. 1. Rather, the invention can be applied to any type of integrated circuit structures where it would be desirable to decrease soft errors, cell leakage, or both. Examples of such structures include registers and latch circuits. In addition, many of the features discussed, such as ion implants 212, 214, 312, and 314 are optional, and can be omitted or modified without deviating from the scope and spirit of the invention.

Figure 4:
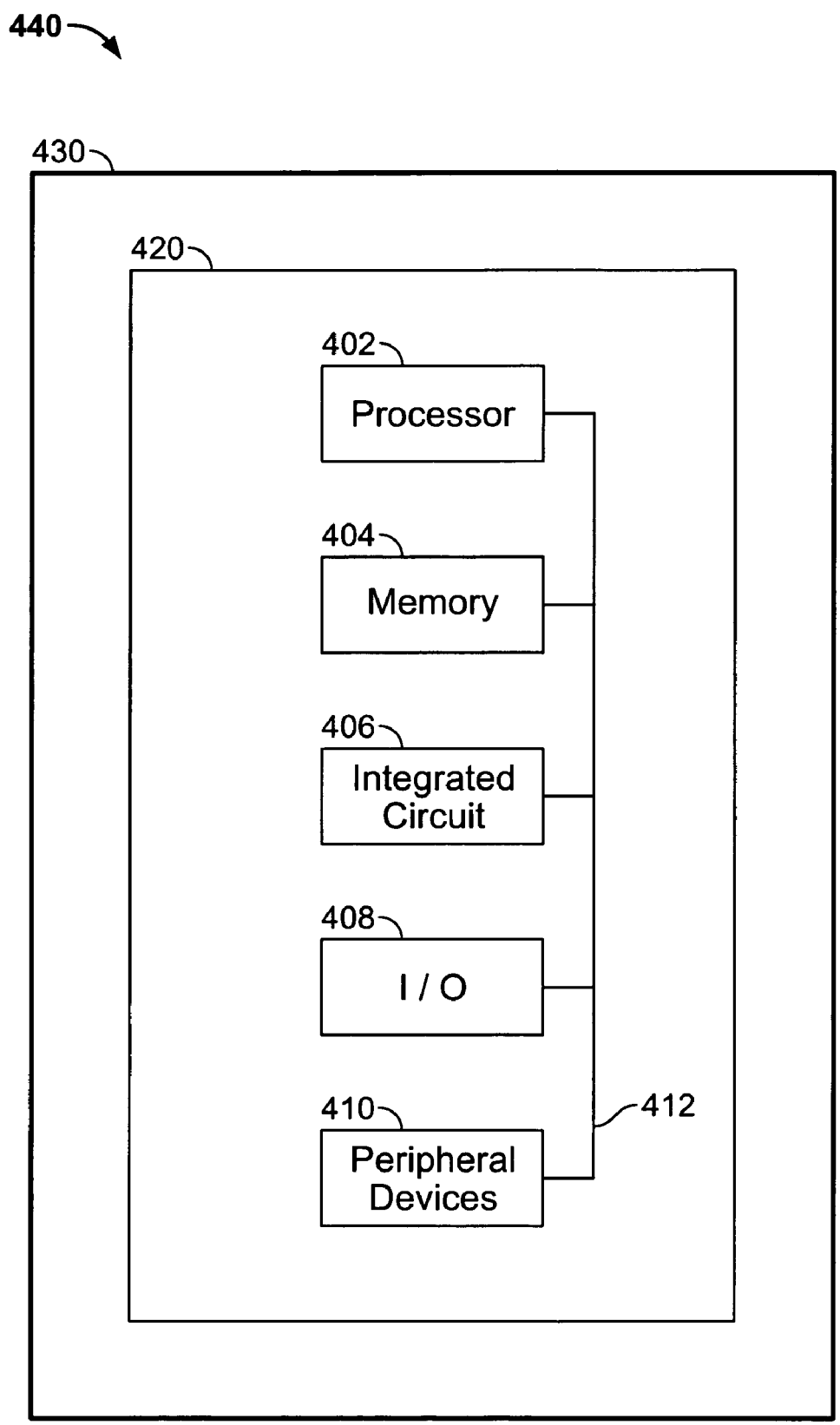
FIG. 4 is a diagram of an illustrative system incorporating the invention.

FIG. 4 illustrates an IC 406, which incorporates the memory circuitry of this invention, in a data processing system 440. IC 406 may be a PLD, an application-specific integrated circuit ("ASIC"), or a combination of the two. If IC 406 is a PLD, it may include programmable logic circuitry that accesses the memory circuitry of the invention. Data processing system 440 may include one or more of the following components: processor 402; memory 404; I/O circuitry 408; and peripheral devices 410. These components are coupled together by a system bus 412 and are populated on a circuit board 420 which is contained in an end-user system 430. As another example, the memory circuitry of the invention may be used in memory 404.

System 440 can be used in a wide variety of applications, such as computer networking, data networking, instrumentation, video processing, or digital signal processing. IC 406 can be used to perform a variety of different logic functions. For example, IC 406 can be configured as a processor or controller that works in cooperation with processor 402. IC 406 may also be used as an arbiter for arbitrating access to a shared resource in system 440. In yet another example, IC 406 can be configured as an interface between processor 402 and one of the other components in system 440.

Thus it is seen that circuits and methods are provided for decreasing soft errors and cell leakage in integrated circuit structures. One skilled in the art will appreciate that the invention can be practiced by other than the described embodiments, which are presented for purposes of illustration and not of limitation, and the present invention is limited only by the claims which follow.

We claim:

1. A memory cell comprising:
a source of relatively high voltage;
a source of relatively low voltage;
first and second nodes for respectively storing complementary first and second voltages indicative of information;
first and second pull-up thin-film transistors coupled between said first and second nodes, respectively, and said source of relatively high voltage; and
first and second pull-down thin-film transistors coupled between said first and second nodes, respectively, and said source of relatively low voltage, wherein each of said thin-film transistors comprises:

an isolation layer;
a polysilicon layer coupled to said isolation layer, wherein said polysilicon layer is divided into three serially adjacent regions doped in alternating polarities;
a dielectric coupled to said polysilicon layer; and
a gate coupled to said dielectric.

2. The memory cell of claim 1 wherein at any steady-state time one of said first and second voltages is substantially equal to said relatively high voltage and the other of said first and second voltages is substantially equal to said relatively low voltage.

3. The memory cell of claim 1 further comprising first and second pass-gate thin-film transistors respectively coupled to said first and second nodes.

4. The memory cell of claim 1 wherein:
said pull-up thin-film transistors are of a type that is one of N-type and P-type; and
said pull-down thin-film transistors are of a type that is the other of N-type and P-type.

5. The memory cell of claim 1 wherein said isolation layer comprises trench isolation.

6. The memory cell of claim 1 wherein each of said thin-film transistors further comprises an ion implant between each adjacent pair of the regions in the serially adjacent regions.

7. The memory cell of claim 6 wherein each of said ion implants comprises a halo implant.

8. The memory cell of claim 6 wherein said dielectric has a higher dielectric constant ("K") than silicon dioxide.

9. The memory cell of claim 1 wherein each of said thin-film transistors includes a gate, wherein the gates of said first pull-up and first pull-down thin-film transistors are connected to said second node, and wherein the gates of said second pull-up and second pull-down thin-film transistors are connected to said first node.

10. A programmable logic device comprising:
programmable logic; and
a memory coupled to said programmable logic, said memory comprising the memory cell of claim 1.

11. A data processing system comprising:
the programmable logic device of claim 10;
processing circuitry coupled to said programmable logic device; and
memory coupled to said programmable logic device and said memory.

12. A printed circuit board on which is mounted a memory cell as defined in claim 1.

13. The printed circuit board of claim 12 further comprising a memory mounted on the printed circuit board and coupled to the memory cell.

14. The printed circuit board of claim 12 further comprising a processor mounted on the printed circuit board and coupled to the memory cell.

15. A method of writing data to a memory cell, said method comprising:
driving a relatively low voltage onto a first data line;
driving a relatively high voltage onto a second data line;
coupling said relatively low driven voltage to a first memory node of said memory cell through a first pass-gate thin-film transistor when a first input signal is received at said pass-gate thin-film transistor;
coupling said relatively high driven voltage to a second memory node of said memory cell through a second pass-gate thin-film transistor when a second input signal, different from said first input sicinal, is received at said second pass-gate thin-film transistor;

activating a pull-up thin-film transistor responsive to one of said driven voltages;

activating a pull-down thin-film transistor responsive to the other of said driven voltages;

coupling said second memory node to a source of relatively high voltage through said activated pull-up thin-film transistor; and coupling said first memory node to a source of relatively low voltage through said activated pull-down thin-film transistor.

16. The method of claim 15 further comprising:

decoupling said relatively low voltage from said one of said memory nodes; and decoupling said relatively high voltage from said other of said memory nodes.

17. A method of reading data from a memory cell, said method comprising:

receiving a first input signal;

establishing a first electrical connection between a first node of said memory cell and a first data line by activating a first pass-gate thin-film transistor coupled between said first node and said first data line in response to receiving said first input signal;

receiving a second input signal different from said first input signal; and establishing a second electrical connection between a second node of said memory cell and a second data line by activating a second pass-gate thin-film transistor coupled between said second node and said second data line in response to receiving said second input signal.

18. The method of claim 17 wherein:

said first node carries a relatively high voltage; and said second node carries a relatively low voltage.

19. The method of claim 18 further comprising:

disabling said first electrical connection by deactivating said first pass-gate thin-film transistor; and disabling said second electrical connection by deactivating said second pass-gate thin-film transistor.

* * * * *

UNITED STATES PATENT AND TRADEMARK OFFICE
CERTIFICATE OF CORRECTION

PATENT NO.       : 7,372,720 B1
APPLICATION NO.  : 11/059280
DATED            : May 13, 2008
INVENTOR(S)      : Sungki O. Hugh et al.

It is certified that error appears in the above-identified patent and that said Letters Patent is hereby corrected as shown below:

Cover page, item (75), inventor: change "Yow-Juang B Lu" to --Yowjuang (Bill) Liu--

Signed and Sealed this

Twentieth Day of January, 2009

JON W. DUDAS
*Director of the United States Patent and Trademark Office*